US011294095B2

(12) United States Patent
Mustapha

(10) Patent No.: US 11,294,095 B2
(45) Date of Patent: Apr. 5, 2022

(54) RESERVOIR SIMULATIONS WITH FRACTURE NETWORKS

(71) Applicant: Schlumberger Technology Corporation, Sugar Land, TX (US)

(72) Inventor: Hussein Mustapha, Didcot (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 860 days.

(21) Appl. No.: 15/752,227

(22) PCT Filed: Jul. 20, 2016

(86) PCT No.: PCT/US2016/043037
§ 371 (c)(1),
(2) Date: Feb. 12, 2018

(87) PCT Pub. No.: WO2017/030725
PCT Pub. Date: Feb. 23, 2017

(65) Prior Publication Data
US 2019/0025460 A1 Jan. 24, 2019

Related U.S. Application Data

(60) Provisional application No. 62/206,408, filed on Aug. 18, 2015.

(51) Int. Cl.
*G01V 99/00* (2009.01)
*E21B 43/00* (2006.01)
(Continued)

(52) U.S. Cl.
CPC ........ *G01V 99/005* (2013.01); *E21B 41/0092* (2013.01); *E21B 43/00* (2013.01);
(Continued)

(58) Field of Classification Search
CPC .......... G01V 99/005; G01V 2210/646; E21B 43/00; E21B 41/0092; E21B 49/00; G06F 30/20
See application file for complete search history.

(56) References Cited

U.S. PATENT DOCUMENTS 7,565,278 B2 7/2009 Li et al.
9,361,414 B2 * 6/2016 Mustapha ............... G06F 30/23
(Continued)

FOREIGN PATENT DOCUMENTS

EP 2581767 A1 4/2013
EP 3018502 A2 5/2016
(Continued)

OTHER PUBLICATIONS

Mustapha. "Multiphase flow simulations in heterogeneous fractured media through hybrid grid method". 11th International Conference of Numerical Analysis and Applied Mathematics 2013. AIP Conf. Proc. 1558, 2048-2054 (2013); doi: 10.1063/1.4825938. 8 Pages. (Year: 2013).*
(Continued)

*Primary Examiner* — Eunhee Kim

(57) ABSTRACT

Systems and methods are described for performing a reservoir simulation for a subterranean formation with a fracture network by receiving data representing the subterranean formation, obtaining a matrix grid based on the data, where the matrix grid includes matrix grid control volumes, generating a fracture network based on the data, identifying a location of a fracture-fracture intersection within the fracture network, discretizing the fracture network into fracture network control volumes, where the fracture network is discretized independently of the matrix grid, identifying a location of a matrix-fracture intersection between the matrix grid control volumes and fracture network control volumes, calculating a transmissibility for the fracture-fracture intersection and the matrix-fracture intersection, and performing (Continued)

the reservoir simulation based on the transmissibility for the fracture-fracture intersection and the matrix-fracture intersection.

19 Claims, 11 Drawing Sheets

(51) Int. Cl.
    *G06F 30/20* (2020.01)
    *E21B 41/00* (2006.01)
    *E21B 49/00* (2006.01)

(52) U.S. Cl.
    CPC .............. *G06F 30/20* (2020.01); *E21B 49/00* (2013.01); *G01V 2210/646* (2013.01)

(56) References Cited

U.S. PATENT DOCUMENTS

| | | | |
|---|---|---|---|
| 2009/0005996 | A1 | 1/2009 | Delorme et al. |
| 2010/0138196 | A1 | 6/2010 | Hui et al. |
| 2012/0158380 | A1* | 6/2012 | Hajibeygi ............... G06F 17/11 703/2 |
| 2014/0046636 | A1 | 2/2014 | Mustapha |
| 2016/0131800 | A1* | 5/2016 | Pecher .................... E21B 49/00 703/10 |

FOREIGN PATENT DOCUMENTS

| | | |
|---|---|---|
| WO | 2008/070526 A2 | 6/2008 |
| WO | 2010/115211 A1 | 10/2010 |

OTHER PUBLICATIONS

Adler, et al., "Fractures and fracture networks," Kluwer, 1999, p. 344.
Baca, et al., "Modeling Fluid Flow in Fractured-Porous Rock Masses by Finite-Element Techniques," International Journal for Numerical Methods in Fluids, 1984, vol. 4, pp. 337-348.
Bogdanov, et al., "Two-phase flow through fractured porous media," Physical Review E, 2003, vol. 68(2), pp. 1-24.
Bourgueat, "Homogenized behavior of two-phase flows in naturally fissured reservoirs with uniform fractures distribution," Computer Methods in Applied Mechanics and Engineering, 1984, vol. 47, Issues 1-2, pp. 205-216.
Graf, et al., "A method to discretize non-planar fractures for 3D subsurface flow and transport simulations," International Journal for Numerical Methods in Fluids, 2008, vol. 56, pp. 2069-2090.
Karimi-Fard, et al., "An Efficient Discrete-Fracture Model Applicable for General Purpose Reservoir Simulators," SPE Journal, 2004, 9(2), pp. 227-236.
Karimi-Fard, et al., "Numerical Simulation of Water Injection in Fractured Media Using Discrete-Fracture Model and The Galerkin Method," SPE Reservoir Evaluation & Engineering, 2003, pp. 117-126.
Kazemi, et al., "Pressure Transient Analysis of Naturally Fractured Reservoirs With Uniform Fracture Distribution," SPE Journal, 1969, pp. 451-462.
Moinfar, et al., "Development of an Efficient Embedded Discrete Fracture Model for 3D Compositional Reservoir Simulation in Fractured Reservoirs," SPE-154246-PA, SPE Journal, Apr. 2014, pp. 289-303.
Mustapha, "A Gabriel-Delaunay Triangulation of Complex Fractured Media for Multiphase Flow Simulations," ECMOR XIII—13th European Copnference on the Mathematics of Oil Recovery, Sep. 10-13, 2012, Biaritz, France.
Mustapha, "Simulation numérique de l'écoulement dans des milieux fracturés tridimensionnels," Thése de Doctorat, Université de Rennes 1. 2005.
Mustapha, et al., "A New Approach to Simulating Flow in Discrete Fracture Networks with an Optimized Mesh," SIAM Journal on Scientific Computing, 2007, vol. 29, No. 4, pp. 1439-1459.
Mustapha, et al., "An efficient method for discretizing 3D fractured media for subsurface flow and transport simulations," International Journal for Numerical Methods in Fluids, 2011, vol. 67(5), pp. 651-670. DOI: 10.1002/fld.2383.
Mustapha, et al., "Discretizing two-dimensional complex fractured fields for incompressible two-phase flow," International Journal for Numerical Methods in Fluids, 2011, vol. 65, pp. 764-780. DOI: 10.1002/fld.2197.
Panfili, et al., "Simulation of Miscible Gas Injection in a Fractured Carbonate Reservoir using an Embedded Discrete Fracture Model," Abu Dhabi SPE International Petroleum Exhibition and Conference, Nov. 10-13, 2014, Abu Dhabi, UAE, SPE-171830-MS.
International Search Report and Written Opinion for the equivalent International patent application PCT/US2016/043037 dated Nov. 1, 2016.
Communication pursuant to Article 94(3) for the cross referenced European patent application 16837462.7 dated Jan. 24, 2020.
Extended Search Report for the equivalent European patent application 16837462.7 dated Mar. 27, 2019.
International Preliminary Report on Patentability for the equivalent International patent application PCT/US2016/043037 dated Mar. 1, 2018.
Communication pursuant to Article 94(3) EPC dated Aug. 20, 2020 in corresponding European Patent Application No. 16 837 462.7, 4 pages.

* cited by examiner

ABSTRACT# RESERVOIR SIMULATIONS WITH FRACTURE NETWORKS

CROSS-REFERENCE TO RELATED APPLICATIONS

This application claims priority to U.S. Provisional Patent Application Ser. No. 62/206,408, which was filed on Aug. 18, 2015 and is incorporated herein by reference in its entirety.

BACKGROUND

Reservoir simulations use computer models to predict the flow of fluids (e.g., oil, water, or gas) through porous media in a reservoir. Reservoir simulation can provide information that allows engineers to maximize the recovery within the oil and gas reservoirs, for example, forecasting reservoir production, informing the selection of wellbore trajectories and locations, informing the selection injection pressures, etc.

In reservoirs that include fracture networks (e.g., naturally-formed fracture networks and/or fracture networks that result from hydraulic fracturing), numerous difficulties can exist in developing the computer models to predict the fluid flow in the reservoir. For example, the fracture networks may make contributions to both the storage (porosity) and the fluid flow rates (permeability or transmissibility) of the reservoir. Thus, fracture networks can have a large impact on the performance of the reservoir, and may be accounted for in the computer models to maximize the recovery within the reservoir.

SUMMARY

Systems, apparatus, computer-readable media, and methods are disclosed for performing a reservoir simulation for a subterranean formation with a fracture network by receiving data representing the subterranean formation, obtaining a matrix grid based on the data, where the matrix grid includes matrix grid control volumes, generating a fracture network based on the data, identifying a location of a fracture-fracture intersection within the fracture network, discretizing the fracture network into fracture network control volumes, where the fracture network is discretized independently of the matrix grid, identifying a location of a matrix-fracture intersection between the matrix grid control volumes and fracture network control volumes, calculating a transmissibility for the fracture-fracture intersection and the matrix-fracture intersection, and performing the reservoir simulation based on the transmissibility for the fracture-fracture intersection and the matrix-fracture intersection.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures.

DETAILED DESCRIPTION

Reference will now be made in detail to embodiments, examples of which are illustrated in the accompanying drawings and figures. In the following detailed description, numerous specific details are set forth in order to provide a thorough understanding of the disclosure. However, it will be apparent to one of ordinary skill in the art that certain embodiments of the disclosure may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are used to distinguish one element from another. For example, a first object could be termed a second object, and, similarly, a second object could be termed a first object, without departing from the scope of the disclosure. The first object and the second object are both objects, but they are not to be considered the same object.

The terminology used in the description herein is for the purpose of describing particular embodiments and is not intended to be limiting. As used in the description and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

Attention is now directed to processing procedures, methods, techniques, and workflows that are in accordance with some embodiments. Some operations in the processing procedures, methods, techniques, and workflows disclosed herein may be combined and/or the order of some operations may be changed.

Figure 1:
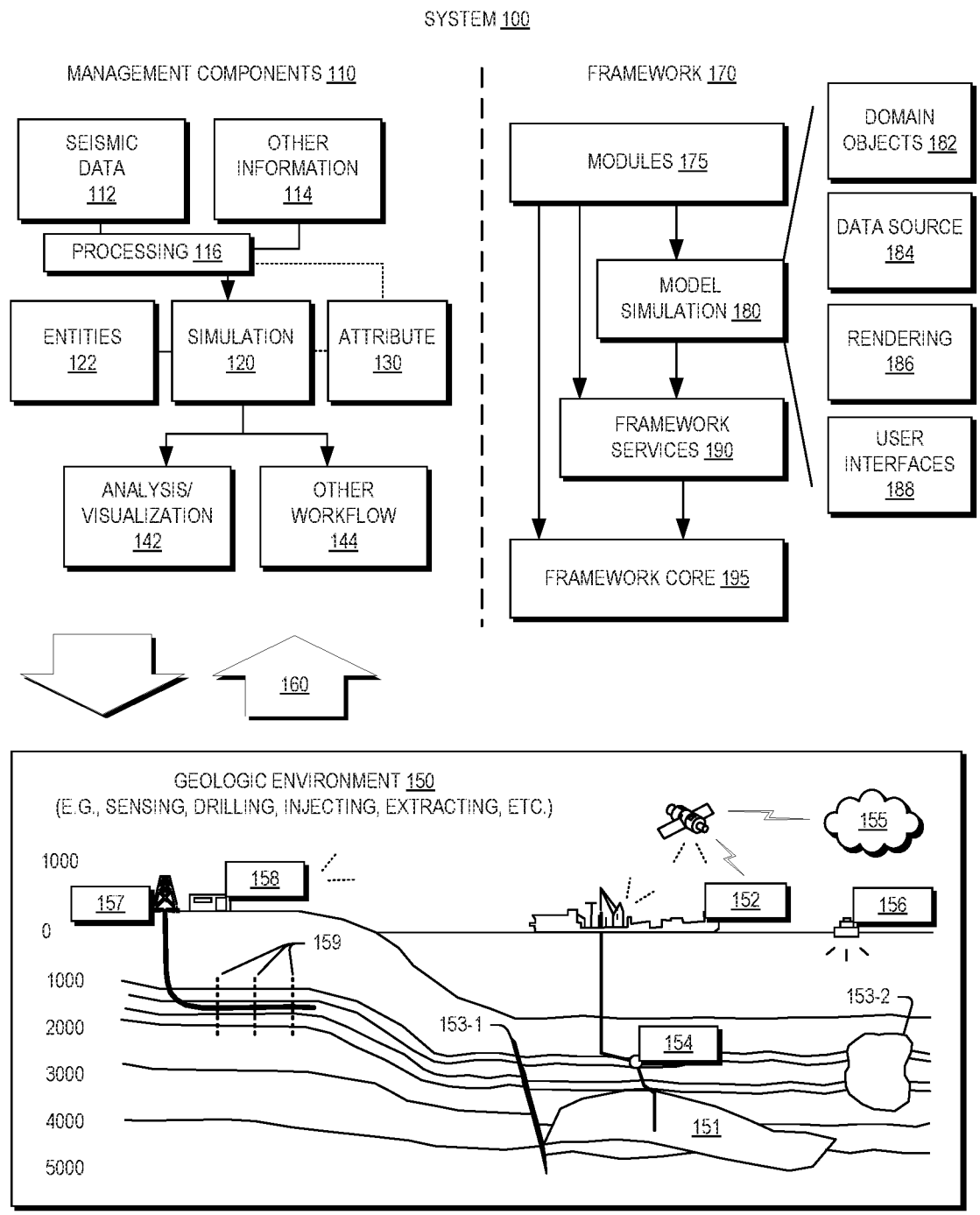
FIG. 1 illustrates an example of a system that includes various management components to manage various aspects of a geologic environment, according to an embodiment.

FIG. 1 illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142, and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT® .NET® framework (Redmond, Wash.), which provides a set of extensible object classes. In the .NET® framework, an object class encapsulates a module of reusable code and associated data structures. Object classes can be used to instantiate object instances for use by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Tex.), the INTERSECT™ reservoir simulator (Schlumberger Limited, Houston Tex.), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Tex.) allows for integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or alternatively include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a workstep may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

In some embodiments, system 100 and/or simulation component 120 may be used for reservoir simulation. For example, current measurements of a reservoir (e.g., measurements extracted during a well test of an oil, gas, or water reservoir) can be input into system 100 and/or simulation component 120, and system 100 and/or simulation component 120 can perform a simulation to determine expected measurements in the future. The expected measurements can be used to, in some implementations, determine well extraction rates, determine which reservoirs to expend resources on, determine well locations, determine when to terminate reservoir extraction, provide visualizations of reservoir simulations, etc. Examples of reservoir measurements include well extraction rates, volumetric flow rates, well pressure, gas/oil ratio, composition of fluid in the reservoir, etc.

Embodiments of the disclosure may provide systems, methods, and computer-readable media for providing reservoir simulations (e.g., fluid flow simulations) that include fracture networks. A facture network can include, for example, natural fractures, artificial fractures (e.g., hydraulic fractures), or a combination of natural and artificial fractures.

Due to, for example, the computational expense of accounting for fluid transfer between fracture networks and the surrounding matrix rock, some reservoir simulation technologies assume that intrinsic matrix permeability in fracture network situations is generally low enough to justify neglecting to account for the transfer. Other models, such as the Embedded Fracture Model (EFM) and the Double Porosity Model, account for the transfer between fracture networks and the surrounding matrix rock, thereby reducing computational expense. Thus, in some embodiments and to achieve greater accuracy in the models, the effects of matrix-fracture and fracture-fracture transfer can be accounted for in reservoir simulation.

Figure 2:
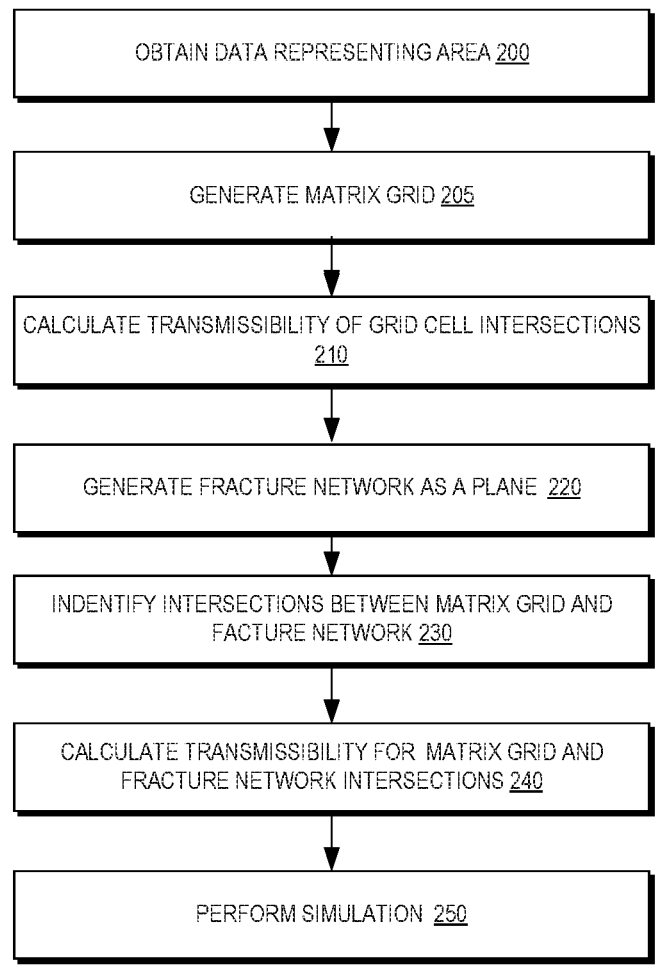
FIG. 2 illustrates an example of a method for performing a reservoir simulation using an Embedded Fracture Model (EFM), according to an embodiment.

FIG. 2 illustrates an example of a method for performing a reservoir simulation using an Embedded Fracture Model (EFM). In some embodiments, the example method illustrated in FIG. 2 can be performed using a computing device that includes the framework (e.g., framework 170) and the management components (e.g., management components 110) described above with reference to FIG. 1.

The example method can begin in 200, when the computing device obtains data representing the area (e.g., a subterranean formation, such as a reservoir) that is being simulated. The data may include measured properties of a reservoir determined using, for example, core samples, seismic analysis, nuclear magnetic resonance, gamma ray logging, any other type of well logging, etc. Such properties can be collected using devices such as well-logging tools, logging-while-drilling devices, seismic receivers (e.g., geophones), imaging devices, etc. Measured properties can include, for example, rock type, porosity, permeability, pore volume, volumetric flow rates, well pressure, gas/oil ratio, composition of fluid in the reservoir, etc.

In 205, the computing device can generate a grid of the surrounding matrix rock ("matrix grid') in the area that is being simulated. In some implementations, the matrix grid can be generated based on the data representing the reservoir. In various embodiments, the matrix grid can be generated by separating the simulation area into a three-dimensional grid, with each grid cell representing a separate control volume. Thus, the individual control volumes can represent a three-dimensional volume in fixed space in the simulation area. In some embodiments, each control volume can represent a cube shape in fixed space.

Use of the control volume allows calculation of reservoir properties (e.g., water saturation) for a small part of the entire reservoir so that physical laws can be easily applied, and, in some instances, certain properties can be assumed to be uniform across discrete units (e.g., each grid cell). Additionally, simulation values (e.g., fluid flow, mechanical deformation, rock failure, etc.) can be calculated based on properties (e.g., pore volume, porosity, etc.) of the discrete grid cell, as well as based on values from neighboring grid cells. For example, fluid outflow of one grid cell can be used to calculate fluid inflow for a neighboring grid cell.

In 210, the computing device can calculate transmissibility for grid cells intersections in the matrix grid. In some embodiments, the transmissibility of fluid between control volumes in the grid can be calculated. For example, the transmissibility can be a function that can be used to determine simulated values that represents the outflow of a fluid from one grid cell and the inflow of the fluid to a neighboring grid cell.

In 220, the computing device can generate a fracture network based on natural and/or artificial fractures within the simulation area. In some implementations, the fracture network can be generated separately from the matrix grid by separating the fracture network into discrete units, with each discrete unit representing a separate control volume. In some embodiments, because a fracture width can be relatively small compared to the size of the entire reservoir, the fracture width can be neglected and a fracture network can correspond to a two-dimensional plane, and a control volume of the fracture network can represent a two-dimensional polygon shape in fixed space.

In some implementations, the fracture network can be generated within the matrix grid such that the fixed space in the simulation area that represents boundaries between grid cells can be the same fixed space in the simulation area that represents boundaries between the discrete units of the fracture network. In further embodiments, the fixed space covered by the matrix grid can extend beyond the fixed space covered by the fracture network and/or the fixed space covered by the fracture network can extend beyond the fixed space covered by the matrix grid.

Thus, the fracture network is separated into discrete units where, in some embodiments, certain properties can be assumed to be uniform across each control volume.

In 230, the computing device can identify intersections between the fracture network and the matrix grid. In some embodiments, one or more discrete units of the fracture network are contained within corresponding grid cells of the matrix grid. Thus, a discrete unit of the fracture network intersects with the grid cell that contains it (i.e., a matrix-fracture intersection). In various embodiments, the location of the matrix-fracture intersections can be stored.

Additionally, in further embodiments, a first discrete unit of the fracture network can connect to a second discrete unit of the fracture network. In other words, a fracture can be contained within more than one discrete unit, and fluid flowing through the entire fracture can pass through each of the discrete units that contain the fracture. Accordingly, the computing device can determine an intersection exists between the two discrete units of the fracture (i.e., a fracture-fracture intersection). In various embodiments, the location of the fracture-fracture intersections can be stored.

In some instances, at least some discrete units of the fracture network may not be connected to a discrete unit of the fracture network contained within a neighboring grid cell. For example, a first grid cell can include part of a first fracture and a second, neighboring grid cell can include part of a second, unconnected fracture. Thus, even though there is an intersection between the first gird cell and the second grid cell, there may not be a corresponding intersection between a discrete unit of the first fracture and a discrete unit of the second fracture.

In 240, the computing device can calculate the transmissibility for facture-fracture control volume intersections and matrix-fracture control volume intersections. In some embodiments, the transmissibility of fluid between control volumes in the grid can be calculated. For example, the transmissibility can be a function that can be used to determine simulated values that represents the outflow of a fluid from a grid cell and the inflow of the fluid to a fracture network control volume within the grid cell or vice versa (i.e., transmissibility for a matrix-fracture intersection). As an additional example, the transmissibility can be a function that can be used to determine simulated values that represents the outflow of a fluid from one fracture network control volume and the inflow of the fluid to a second fracture network control volume in a neighboring grid cell (i.e., transmissibility for a fracture-fracture intersection).

In 250, the computing device can use the matrix grid with the embedded fracture network and the calculated transmissibilities between intersections to perform a reservoir simulation. In some embodiments, the computing device can simulate fluid flow of injected fluids in the reservoir by starting with the inflow of the fluid at the control volume where the fluid is injected (i.e., the inflow rate) and determining a saturation level and outflow rates for each intersection of the control volume. Then, the computing device can simulate the intersecting control volumes, which can include neighboring grid cells and a fracture network control volume within the grid cell. The computing device can use the inflow rate of the neighboring grid cells and the fracture network control volume to determine saturation levels and outflow rates of the neighboring grid cells and fracture network control volume, and the process can be repeated for the remainder of the simulation area.

In some embodiments, the reservoir simulation can be performed in multiple timesteps, and the above described example can be repeated for each timestep.

In other embodiments, a similar simulation could be performed using a Double Porosity Model. For example, a Double Porosity Model could be effective in a situation where the fracture orientations and lengths are relatively randomly distributed and the fracture network is connected extensively. However, the EFM may generally be less computationally expensive in other situations.

In some instances, the above-described EFM considers fractures to be linear. However, fractures may include curves which might not be captured within a single two-dimensional plane. Additionally, the above-described EFM uses a fracture-matrix intersection calculation, which can be geometrically complex and the resulting calculations are, thus, computationally expensive. For example, as described in further detail below, the above-described EFM can result in some relatively very small control volumes which, although they may not represent a large degree of changes in the reservoir properties, may be calculated independently from other control volumes (of relatively larger size). Further, the resulting fracture network may not be K-orthogonal. Still further, fracture network control volumes as described above can be associated with uniform properties. Accordingly, there may be no variation in properties (such as, for example, pressure) within a single control volume. This can result in inaccurate simulations in, for example, situations where a hydraulic fracture is near a well.

Figure 3:
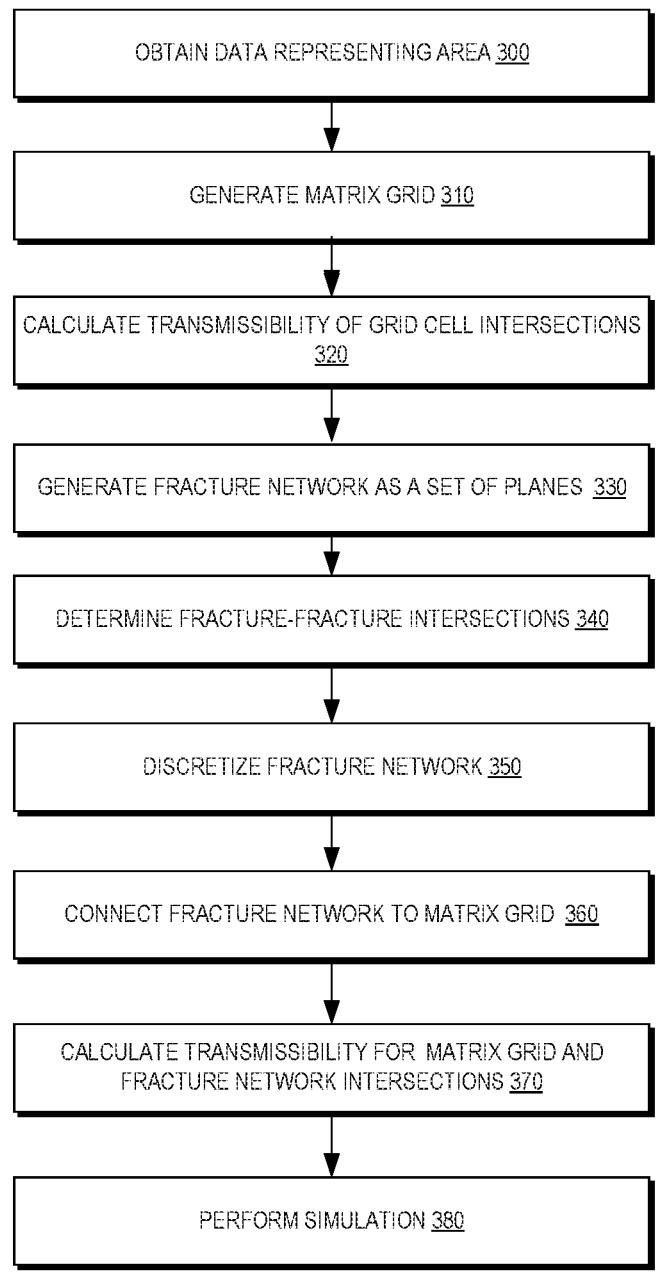
FIG. 3 illustrates an example of a method for performing a reservoir simulation using an improved EFM, according to an embodiment.

Accordingly, a method for generating another EFM is described in detail with regard to FIG. 3. In particular, FIG. 3 illustrates an example of a method for performing a reservoir simulation using an improved EFM. In some embodiments, the example method illustrated in FIG. 3 can be performed using a computing device that includes the framework (e.g., framework 170) and the management components (e.g., management components 110) described above with reference to FIG. 1.

The example method can begin in 300, when the computing device obtains data representing the area (e.g., a subterranean formation, such as a reservoir) that is being simulated, for example, as described in 200 of FIG. 2.

In 310, the computing device can generate a grid of the surrounding matrix rock ("matrix grid") in the area that is being simulated, for example, as described in 205 of FIG. 2.

In 320, the computing device can calculate transmissibility for grid cell intersections in the matrix grid, for example, as described in 210 of FIG. 2.

In 330, the computing device can generate a fracture network based on natural and/or artificial fractures within the simulation area. In some embodiments, because a width of a section of the fracture network can be relatively small (e.g., so as to be negligible) compared to the size of the entire reservoir, a section of a fracture network can correspond to a two-dimensional plane. In various embodiments, the fracture network can be composed of a set of multiple two-dimensional planes, with respective planes representing a section of the fracture network. Accordingly, the set of two-dimensional planes can define a non-linear fracture network, including, for example, curves in the non-linear fracture network.

In 340, the computing device can identify intersections between the sections of the fracture network. For example, in some embodiments, the computing device can identify intersections between two or more planes of the set of two-dimensional planes representing the fracture network based on locations of the two-dimensional planes in three-dimensional space. The locations of the intersections between the sections of the fracture network can be stored.

In 350, the computing device can discretize the fracture network independent of the matrix grid. In some embodiments, the fracture network can be composed of a set of multiple two-dimensional planes. Accordingly, the fracture network can represent an irregular and complex fracture network, and the discrete segments of the fracture network can be calculated in a manner that honors the integrity of the fracture network topology. This can be compared to the EFM described with regard to FIG. 2, where a curved or otherwise irregular fracture network may be represented by a two-dimensional plane, which may not accurately honor the integrity of the fracture network topology.

In some implementations, the fracture network can be discretized by initially discretizing the fracture network into a set of points, obtaining a square size value (e.g., based on a user input), positioning the square in an initial position in the fracture network, and determining if two or more points are included in the square. If two more points are included in the square, the points inside the square can be moved to the center of the square. Otherwise, the square is moved to the next position in the fracture network, and the process is repeated for the entire fracture network. The result can be one or more two-dimensional meshes representing the fracture network. An example of such a process is described in further detail with regard to FIG. 4A.

In further implementations, the fracture network can be discretized by obtaining one or more two-dimensional meshes representing the fracture network, transforming abnormal triangles within the meshes, and generating tetrahedrons to fill the unfilled parts of the fracture network. An example of such a process is described in further detail with regard to FIG. 4B.

In various embodiments, each discrete segment of the fracture network can represent a fracture network control volume. Thus, the individual control volumes can represent two or three-dimensional volumes in fixed space in the simulation area. Additionally, as discussed above with regard to grid cells, use of the control volume allows calculation of reservoir properties (e.g., water saturation) for a small part of the entire fracture network so that physical laws can be easily applied, and, in some instances, certain properties can be assumed to be uniform across discrete units (e.g., each fracture network control volume). Additionally, simulation values (e.g., fluid flow, mechanical deformation, rock failure, etc.) can be calculated based on properties (e.g., pore volume, porosity, etc.) of the discrete control volume, as well as based on values from neighboring control volumes. For example, fluid outflow of one control volume can be used to calculate fluid inflow for a neighboring control volume.

In 360, the computing device can determine fracture-matrix intersections. In some embodiments, one or more discrete units of the facture network are contained within corresponding grid cells of the matrix grid. Thus, a discrete unit of the fracture network intersects with the grid cell that contains it (i.e., a matrix-fracture intersection). In various embodiments, the grid cell that contains a discrete unit of the fracture network can be determined by locating the center of a fracture network control volume (e.g., geometrically using the locations of the corners of the control volume). If the location of center of the fracture network control volume is within a certain grid cell, then the fracture network control volume intersects with the grid cell. In some embodiments, the location of the matrix-fracture intersections can be stored.

In various embodiments, the process of determining matrix-fracture intersections based on determining the center of the fracture network control volumes is less computationally expensive than identifying intersections between the fracture network and the matrix grid in 230 of FIG. 2 because the computing device using the improved EMF does not have to discretize the fracture network within the matrix grid, instead the fracture network can be discretized independently and then the intersections computed using a computationally less expensive algorithm that determines a position of the center of each fracture network control volume.

In 370, the computing device can calculate the transmissibility for facture-fracture control volume intersections and matrix-fracture control volume intersections. In some embodiments, the transmissibility of fluid between control volumes in the grid can be calculated. For example, the transmissibility can be a function that can be used to determine simulated values that represents the outflow of a fluid from a grid cell and the inflow of the fluid to a fracture network control volume within the grid cell or vice versa (i.e., transmissibility for a matrix-fracture intersection). As an additional example, the transmissibility can be a function that can be used to determine simulated values that represents the outflow of a fluid from one fracture network control volume and the inflow of the fluid to a second fracture network control volume in the same grid cell or a neighboring grid cell (i.e., transmissibility for a fracture-fracture intersection).

In 390, the computing device can use the matrix grid with the embedded fracture network and the calculated transmissibilities between intersections to perform a reservoir simulation. In some embodiments, the computing device can simulate fluid flow of injected fluids in the reservoir by starting with the inflow of the fluid at the control volume where the fluid is injected (i.e., the inflow rate) and determining a saturation level and outflow rates for each intersection of the control volume. Then, the computing device can simulate the intersecting control volumes, which can include neighboring grid cells and a fracture network control volume within the grid cell. The computing device can use the inflow rate of the neighboring grid cells and the fracture network control volume to determine saturation levels and outflow rates of the neighboring grid cells and fracture network control volume, and the process can be repeated for the remainder of the simulation area.

In some embodiments, the reservoir simulation can be performed in multiple timesteps, and the above described example can be repeated for each timestep.

Additionally, in further embodiments, the reservoir simulation can be used to generate a visualization of the reservoir simulation to provide information that allows engineers to maximize the recovery within the reservoir.

Accordingly, the above described improved EFM can simulate a non-linear fracture network with improved accuracy by using the set of two or more planes. Additionally, the above-described improved EFM can be less computationally expensive to generate compared to the EFM described with regard to FIG. 2 by discretizing the fracture network independently of the matrix grid, and, thus, not requiring geometrical complex fracture-matrix intersection calculations. Moreover, the above-described improved EFM utilizes efficiently discretized fracture networks (as described in further detail below) and, thus, does not result in relatively very small control volumes. Further, in some embodiments, the resulting fracture network can be K-orthogonal. Still further, the above-described improved EFM can utilize fracture networks with greater granularity and/or efficiently selected granularity than the EFM described with regard to FIG. 2. Thus, the areas of higher importance (e.g., near wells) can result in smaller fracture network control volumes to improve the accuracy of these locations.

Figure 4A:
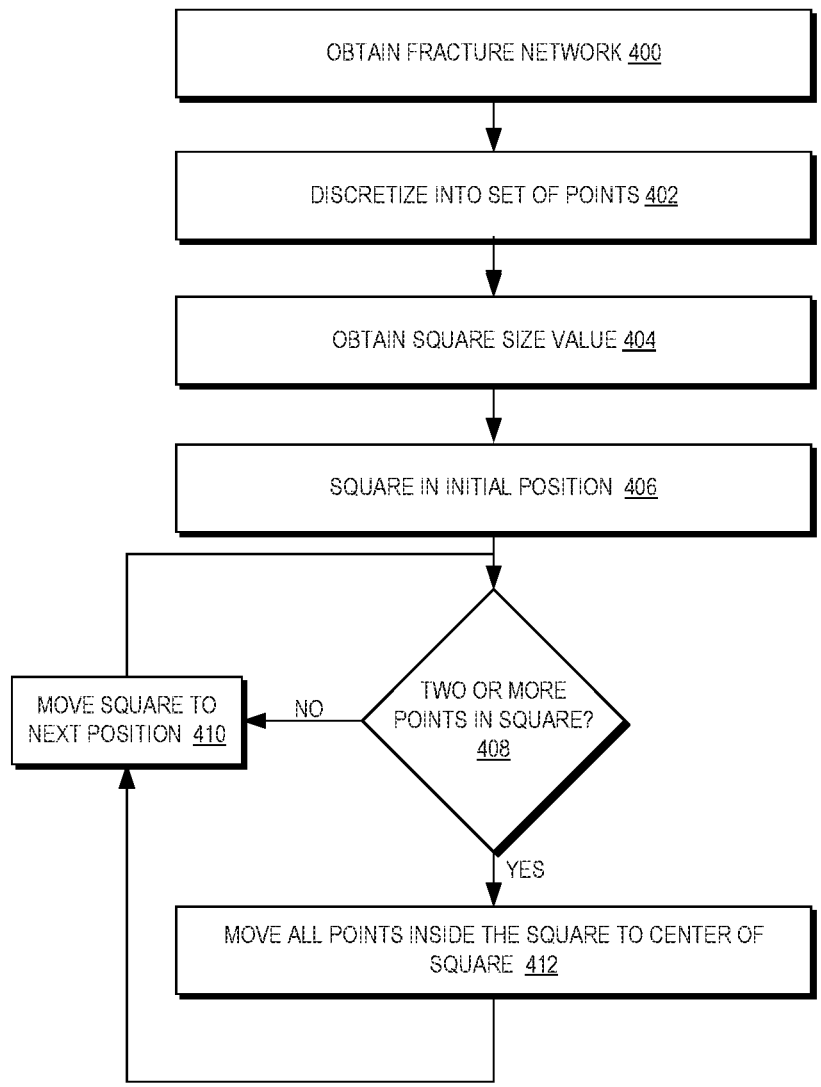
FIG. 4A illustrates an example of a method for discretizing a fracture network, according to an embodiment.

FIG. 4A illustrates an example of a method for discretizing a fracture network. In some embodiments, the example method illustrated in FIG. 4A can be performed using a computing device that includes the framework (e.g., framework 170) and the management components (e.g., management components 110) described above with reference to FIG. 1. In some implementations, the example method can represent the method (or a part thereof) performed by a computing device performing 350 of FIG. 3.

The example method can begin in 400, when the computing device obtains data representing a fracture network (e.g., the fracture network generated as described above in 330 of FIG. 3).

In 402, the computing device can discretize the fractures and the boundaries of a plane of the set of planes into a set of discrete points. For example, points in a single plane of the fracture network can be positioned at equal distances from each other.

In 404, the computing device can obtain a square size value. For example, the square size value can be received as input from a user, can be a predetermined value, can be determined based on the size of the fracture network, etc.

In 406, the computing device can position a square with a side length of the square size value obtained in 404 into an initial position within the fracture network (e.g., a top left corner).

In 408, the computing device can determine if the two or more points of the set of discrete points fall within the square in its current position. If one or zero points are within the square (NO in 408), in 410, the square can be moved to a next position (e.g., immediately to the right of the previous position).

If two or more points are within the square (YES in 408), then the points within the square are moved to the center of the square. In other words, the points are merged into a single point in the center of the square. Then, in 410, the square can be moved to a next position.

The computing device can repeat 408, 410, and 412 until the square has been positioned over the entire fracture network.

Using the positions of the points from 400-412, the computing device can, for example, use Delaunay triangulation to generate a mesh of triangles using the points.

In some embodiments, a triangle in a mesh can represent a discrete unit of the fracture network (i.e., a fracture network control volume). Accordingly, the discrete units determined based on the above process can be the discrete units utilized by the computing device in 360-380, as described with regard to FIG. 3. In some implementations, a mesh can be generated for each plane of a set of planes of a fracture network. In further embodiments, the computing device can further process the mesh of triangles, as described with regard to FIG. 4B.

Figure 4B:
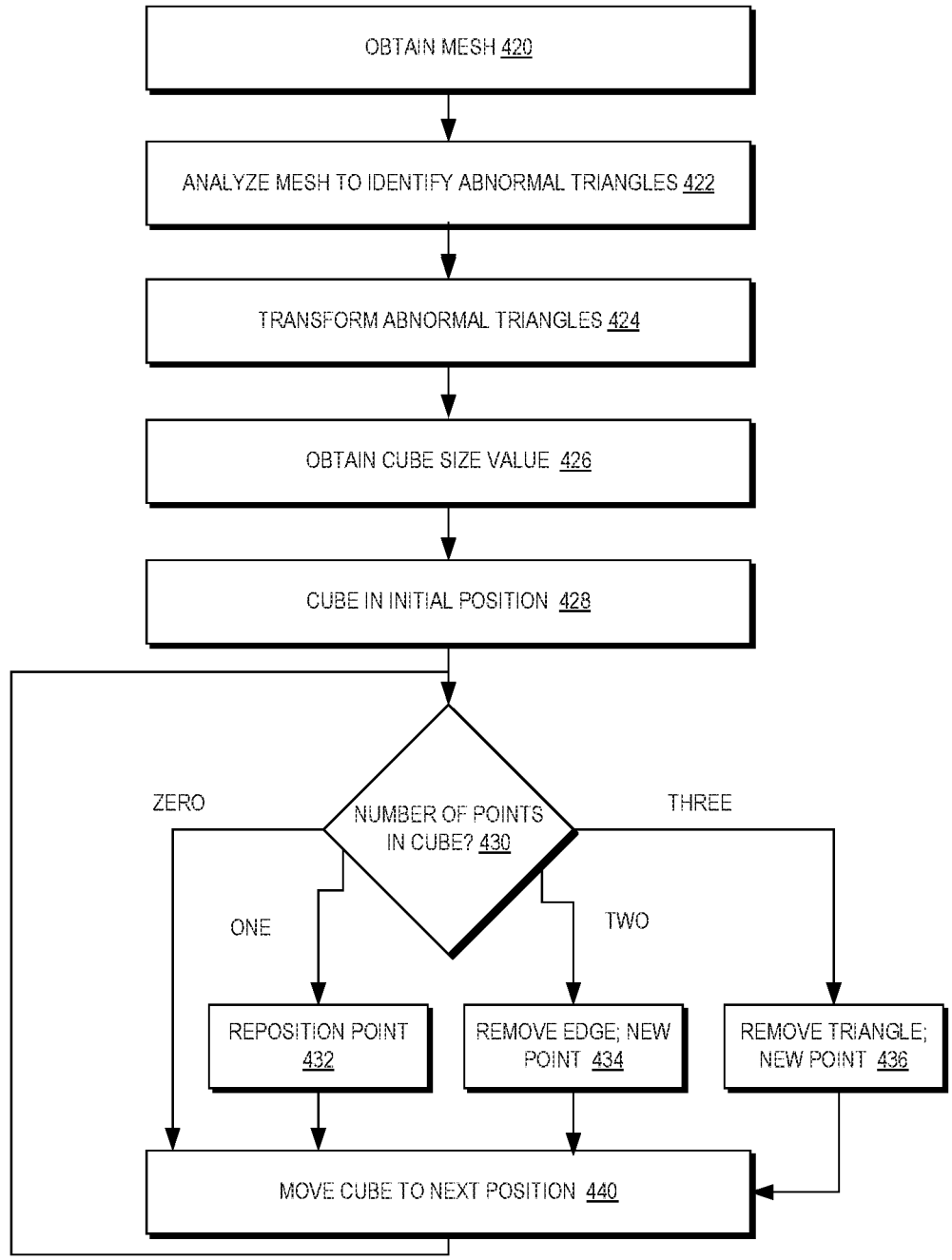
FIG. 4B illustrates an example of a method for discretizing a fracture network, according to an embodiment.

FIG. 4B illustrates an example of a method for discretizing a fracture network. In some embodiments, the example method illustrated in FIG. 4B can be performed using a computing device that includes the framework (e.g., framework 170) and the management components (e.g., management components 110) described above with reference to FIG. 1. In some implementations, the example method can represent the method (or a part thereof) performed by a computing device performing 350 of FIG. 3.

The example method can begin in 420, when the computing device obtains data representing one or more meshes of triangles (e.g., meshes of triangles generated in the process described in FIG. 4A and representing a fracture network).

In 422, the computing device can analyze the meshes and determine triangles within the meshes that are abnormal. For example, in some embodiments, equilateral triangles can be determined to be normal triangles and scalene triangles can be determined to be abnormal triangles. In further embodiments, triangles can be determined to be abnormal triangles based on differences in the sides of the triangles. For example, if the differences between the sides is greater than a threshold, the triangle can be identified as abnormal. In still further embodiments, triangles can be determined to be abnormal triangles by identifying triangles with sides that are less than a threshold.

In 424, the computing device can transform the abnormal triangles. For example, triangles with sides that are less than a threshold can be adjusted so that the sides are greater than or equal to the threshold.

In 426, the computing device can obtain a cube size value. For example, the cube size value can be received as input from a user, can be a predetermined value, can be determined based on the size of the fracture network, etc.

In 428, the computing device can position a cube with a side length of the cube size value obtained in 426 into an initial position within the fracture network (e.g., a top left corner).

In 430, the computing device can determine if any points are within the cube. If no points are within the cube (ZERO in 430), in 440, the computing device can move the cube to a next position (e.g., immediately to the right of the previous position).

If there is a single point within the cube (ONE in 430), in 432, the position of the single point can be repositioned to the cube center. Then, in 440, the computing device can move the cube to a next position.

If there are two points within the cube forming an edge of a triangle (TWO in 430), in 434, the edge and the two triangles that include the edge can be removed, and a new point can be placed at the cube center. The triangles surrounding the removed triangles can be joined at the new point. Then, in 440, the computing device can move the cube to a next position.

If there are three points within the cube forming a triangle (THREE in 430), in 436, the triangle and the three triangles that share an edge with the triangle can be removed, and a new point can be placed at the cube center. The triangles surrounding the removed triangles can be joined at the new point. Then, in 440, the computing device can move the cube to a next position.

In instances other than those presented above, the above processes can be combined to create a single point in the center of the cube.

The computing device can repeat 430-440 until the cube has been positioned over the entire fracture network.

Using the triangles from 420-440, the computing device can, for example, use Delaunay triangulation to connect the triangles to form a three-dimensional mesh of tetrahedrons. In some embodiments, a tetrahedron in the three-dimensional mesh can represent a discrete unit of the fracture network (i.e., a fracture network control volume). Accordingly, the discrete units determined based on the above process can be the discrete units utilized by the computing device in 360-380, as described with regard to FIG. 3.

Figure 5:
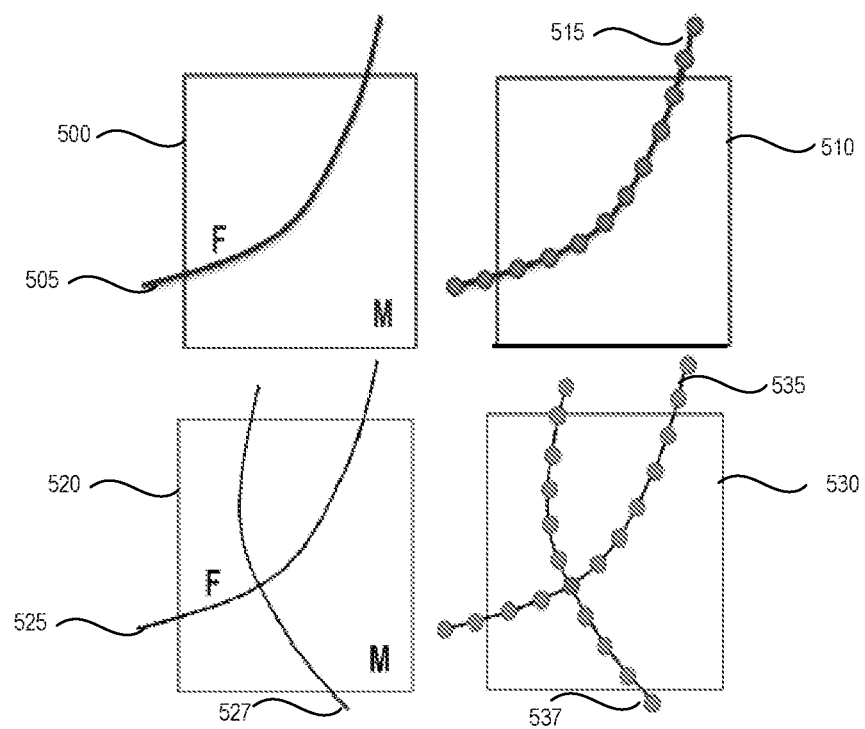
FIG. 5 illustrates example two-dimensional diagrams of fractures, according to an embodiment.

FIG. 5 illustrates example two-dimensional diagrams of fractures. As shown in FIG. 5, the fractures are embedded within a section of a two-dimensional grid.

Grid section 500 contains a section of fracture 505. Accordingly, fracture 505 is embedded within grid section 500. For example, fracture 505 can be embedded within grid section 500 as described with regard to FIG. 2. As such, fracture 505 can be continuous within grid section 500 and certain properties of fracture 505 can be assumed to be uniform across grid section 500.

Grid section 510 contains a section of fracture 515. Additionally, fracture 515 can be discretized independently from grid section 510. For example, fracture 515 can be discretized as described with regard to FIG. 4A. Accordingly, fracture 515 can include multiple discrete units within grid section 510 and, unlike fracture 505, certain properties of fracture 515 can vary across grid section 510. Accordingly, in some instances, because fracture 515 has a greater granularity than fracture 505, properties of discrete units of fracture 515 can be more accurate and better represent measured and/or simulated properties of fracture 515 compared to fracture 505.

Grid section 520 contains a section of fracture 525 and a section of fracture 527. Accordingly, fractures 525 and 527 are embedded within grid section 520. For example, fractures 525 and 527 can be embedded within grid section 520 as described with regard to FIG. 2. Accordingly, fractures 525 and 527 can be continuous within grid section 520 and certain properties of fractures 525 and 527 can be assumed to be uniform across grid section 520.

Grid section 530 contains a section of fracture 535 and a section of fracture 537. Additionally, fractures 535 and 537 can be discretized independently from grid section 530. For example, fractures 535 and 537 can be discretized as described with regard to FIG. 4A. Accordingly, fractures 535 and 537 can include multiple discrete units within grid section 530 and, unlike fractures 525 and 527, certain properties of fractures 535 and 537 can vary across grid section 530. Accordingly, in some instances, because fractures 535 and 537 have greater granularity than fractures 525 and 527, properties of discrete units of fractures 535 and 537 can be more accurate and better represent measured and/or simulated properties of fractures 535 and 537 compared to fractures 525 and 527.

Figure 6:
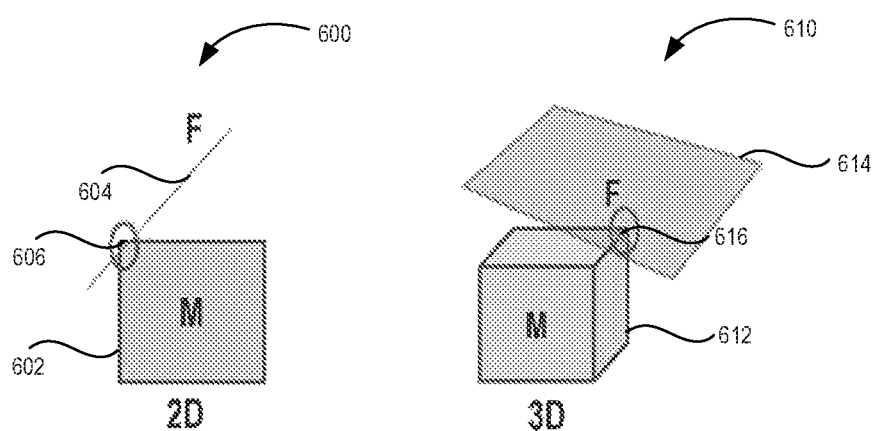
FIG. 6 illustrates example diagrams of small control volumes that can result in inefficiencies in embedded fracture models, according to an embodiment.

FIG. 6 illustrates example diagrams of small control volumes that may form in some embedded fracture models.

Example 600 represents a two-dimensional representation of matrix grid section 602 and fracture section 604. As shown in FIG. 6, fracture section 604 can intersect at a corner of matrix grid section 602. Accordingly, if control volumes are generated based on the intersections of the matrix grid and the fracture network, a very small control volume 606 can be generated.

Example 610 represents a three-dimensional representation of matrix grid section 612 and fracture section 614. As shown in FIG. 6, fracture section 614 can intersect at a corner of matrix grid section 612. Accordingly, if control volumes are generated based on the intersections of the matrix grid and the fracture network, a very small control volume 616 can be generated.

As discussed above, small control volumes can lead to inefficiencies in reservoir simulations because very small control volumes which, although they do not represent relatively large changes in the reservoir properties, are calculated independently from other control volumes (of relatively larger size).

Figure 7:
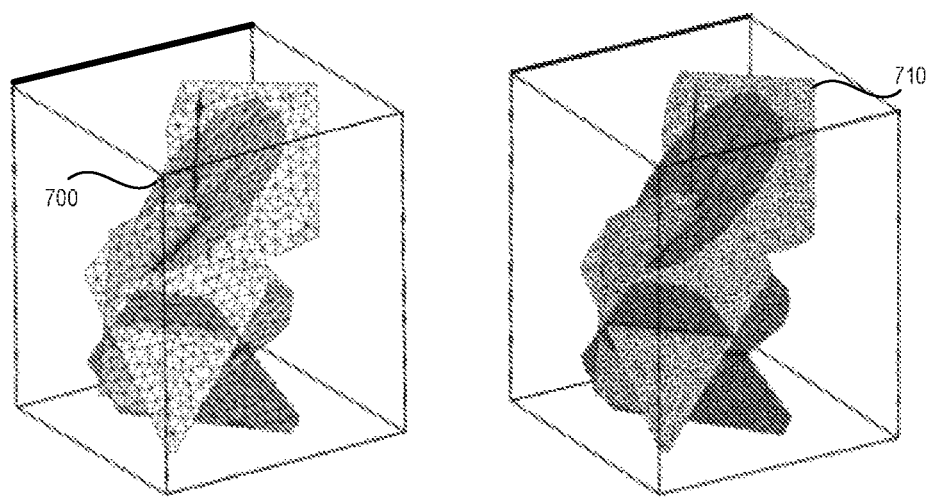
FIG. 7 illustrates example three-dimensional diagrams of fracture networks, according to an embodiment.

FIG. 7 illustrates example three-dimensional diagrams of fracture networks. As shown in FIG. 7, a fracture network may be irregular and complex and, thus, not easily represented in a two-dimensional plane. Accordingly, an EFM that considers fractures to be linear may not be able to accurately simulate a reservoir that includes fracture network 700 or fracture network 710. Additionally, an EFM that uses a fracture-matrix intersection calculation may utilize large amounts of computing resources because the geometrically complex nature of fracture networks 700 and 710 can be computationally expensive to compute.

Fracture network 700 represents a first example of a discretized fracture network. Fracture network 700 may have been discretized into multiple tetrahedrons that are embedded within but not bound by grid sections of a corresponding matrix grid. Fracture network 700 may have been discretized using one or more methods described above.

Fracture network 710 represents a second example of a discretized fracture network. Fracture network 710 may have been discretized into multiple control volumes, with the center of each control volume representing which grid section of a corresponding matrix grid the control volume intersects. Fracture network 710 may have been discretized using one or more methods described above. In some embodiments, determining fracture-matrix intersections based on the center of each control volume can be computationally less expensive than performing fracture-matrix intersection calculations using fracture network control volumes that are bound by grid sections of a matrix grid (e.g., as described with regard to FIG. 2).

Thus, using discretized fracture network 700 or discretized fracture network 710, a computing device can more efficiently and/or more accurately simulate a reservoir with a fracture network.

Figure 8:
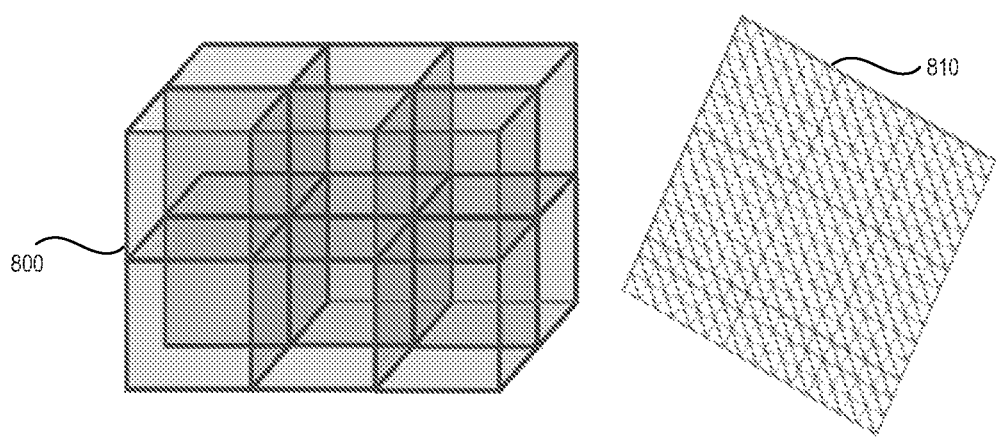
FIG. 8 illustrates an example matrix grid and an example fracture grid, according to an embodiment.

FIG. 8 illustrates an example matrix grid and an example fracture grid.

As shown in FIG. 8, grid 800 represents a three-dimensional visualization that includes twelve control volumes represented by twelve grid cells. In various embodiments, grid 400 can represent a visualization that is generated based on a matrix grid generated by a computing device. In further embodiments, grid 400 can represent a simulation area (e.g., a reservoir) and each grid cell can correspond to a location in fixed space. Additionally, in some implementations, each grid cell can be with associated with one or more properties, such as, for example, rock type, porosity, permeability, pore volume, etc.

As further shown in FIG. 8, fracture network 810 represents a two-dimensional visualization that includes multiple control volumes represented by multiple triangles. In various embodiments, fracture network 810 can represent a visualization that is generated based on a fracture network generated by a computing device. In further embodiments, fracture network 810 can represent a fracture network (natural and/or hydraulic) within a simulation area (e.g., a reservoir) and each discrete unit can correspond to a location in fixed space. Additionally, in other embodiments, each discrete unit can be with associated with one or more properties, such as, for example, rock type, porosity, permeability, pore volume, etc. In various embodiments, fracture network 810 can represent a visualization that is generated based on a fracture network, where the fracture network is discretized using one or more discretization methods, for example, as described with regard to FIG. 4A or FIG. 4B.

Figure 9:
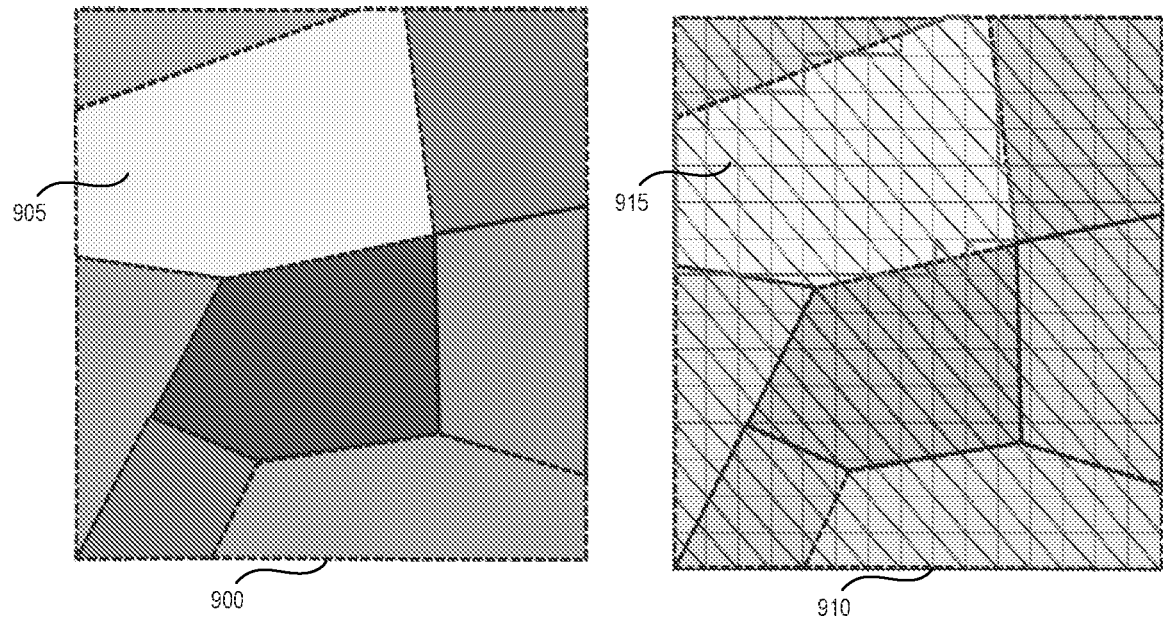
FIG. 9 illustrates example fracture network control volumes, according to an embodiment.

FIG. 9 illustrates example fracture network control volumes.

As shown in FIG. 9, fracture network 900 represents a two-dimensional visualization of a fracture network split into control volumes. In various embodiments, fracture network 900 may have been generated based on intersections with a matrix grid (e.g., as described with regard to FIG. 2). Accordingly, control volume 905 may be contained within a single matrix grid cell.

As further shown in FIG. 9, fracture network 910 represents a two-dimensional visualization of a fracture network split into control volumes. In various embodiments, fracture network 900 may have been discretized independently of a matrix grid (e.g., as described with regard to FIG. 3). Additionally, control volumes can be determined to be contained by and/or intersect with a matrix grid cell based on a location of the center of the control volume, as described above. For example, control volumes within polygon 915 may represent control volumes that are contained by and/or intersect with a single matrix grid cell. Further, control volumes outside of polygon 915 may represent control volumes that are not contained by and/or do not intersect with the single matrix grid cell and are contained by and/or intersect with other matrix grid cells.

Figure 10:
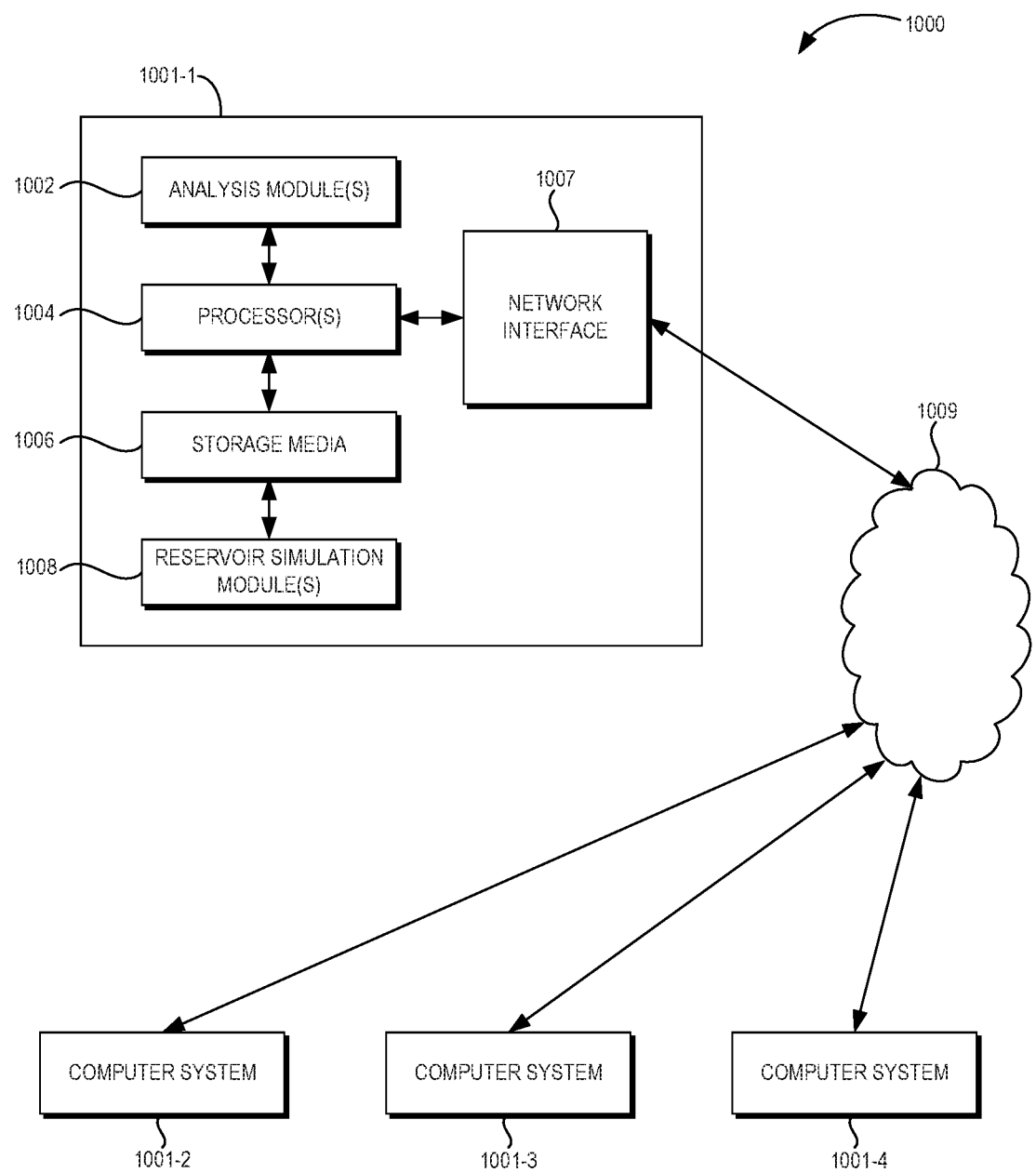
FIG. 10 illustrates an example computing system that may execute methods of the present disclosure, according to an embodiment.

In some embodiments, the methods of the present disclosure may be executed by a computing system. FIG. 10 illustrates an example of such a computing system 1000, in accordance with some embodiments. The computing system 1000 may include a computer or computer system 1001-1, which may be an individual computer system 1001-1 or an arrangement of distributed computer systems. The computer system 1001-1 includes one or more analysis modules 1002 that are configured to perform various tasks according to some embodiments, such as one or more methods disclosed herein. To perform these various tasks, the analysis module 1002 executes independently, or in coordination with, one or more processors 1004, which is (or are) connected to one or more storage media 1006. The processor(s) 1004 is (or are) also connected to a network interface 1007 to allow the computer system 1001-1 to communicate over a data network 1009 with one or more additional computer systems and/or computing systems, such as 1001-2, 1001-3, and/or 1001-4 (note that computer systems 1001-2, 1001-3, and/or 1001-4 may or may not share the same architecture as computer system 1001-1, and may be located in different physical locations, e.g., computer systems 1001-1 and 1001-2 may be located in a processing facility, while in communication with one or more computer systems such as 1001-3 and/or 1001-4 that are located in one or more data centers, and/or located in varying countries on different continents).

A processor may include a microprocessor, microcontroller, processor module or subsystem, programmable integrated circuit, programmable gate array, or another control or computing device.

The storage media 1006 may be implemented as one or more computer-readable or machine-readable storage media. Note that while in the example embodiment of FIG. 10 storage media 1006 is depicted as within computer system 1001-1, in some embodiments, storage media 1001-1 may be distributed within and/or across multiple internal and/or external enclosures of computing system 1001-1 and/or additional computing systems. Storage media 1006 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above may be provided on one computer-readable or machine-readable storage medium, or alternatively, may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 1000 contains reservoir simulation module(s) 1008 for generating matrix grids, generating fracture networks, discretizing fracture networks, visualizing fracture networks and matrix grids, etc. In the example of computing system 1000, computer system 1001-1 includes the reservoir simulation module 1008. In some embodiments, a single reservoir simulation module may be used to perform aspects of one or more embodiments of the methods disclosed herein. In alternate embodiments, a plurality of reservoir simulation modules may be used to perform aspects of methods disclosed herein.

It should be appreciated that computing system 1000 is one example of a computing system, and that computing system 1000 may have more or fewer components than shown, may combine additional components not depicted in the example embodiment of FIG. 10, and/or computing system 1000 may have a different configuration or arrangement of the components depicted in FIG. 10. The various components shown in FIG. 10 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of protection of the disclosure.

Geologic interpretations, models, and/or other interpretation aids may be refined in an iterative fashion; this concept is applicable to the methods discussed herein. This may include use of feedback loops executed on an algorithmic basis, such as at a computing device (e.g., computing system 1000, FIG. 10), and/or through manual control by a user who may make determinations regarding whether a given step, action, template, model, or set of curves has become sufficiently accurate for the evaluation of the subsurface three-dimensional geologic formation under consideration.

The foregoing description, for purpose of explanation, has been described with reference to specific embodiments. However, the illustrative discussions above are not intended to be exhaustive or limited to the precise forms disclosed. Many modifications and variations are possible in view of the above teachings. Moreover, the order in which the elements of the methods described herein are illustrated and described may be re-arranged, and/or two or more elements may occur simultaneously. The embodiments were chosen and described in order to explain principals of the disclosure and practical applications, to thereby enable others skilled in the art to utilize the disclosure and various embodiments with various modifications as are suited to the particular use contemplated.

What is claimed is:

1. A method, comprising:
   receiving data representing a subterranean formation;
   obtaining a matrix grid based on the data representing the subterranean formation, wherein the matrix grid comprises a plurality of matrix grid control volumes;
   generating a fracture network based on the data representing the subterranean formation;
   identifying a location of a fracture-fracture intersection within the fracture network;
   discretizing the fracture network into a plurality of fracture network control volumes, wherein the fracture network is discretized independently of the matrix grid, and wherein each of the fracture network control volumes comprises a fracture network control volume center;
   identifying a location of a matrix-fracture intersection between the plurality of matrix grid control volumes and the plurality of fracture network control volumes, wherein identifying the location of the matrix-fracture intersection comprises identifying a matrix-fracture intersection where a matrix grid control volume contains at least one of the fracture network control volume centers;
   calculating a transmissibility for the fracture-fracture intersection and the matrix-fracture intersection; and
   performing a reservoir simulation based on the transmissibility for the fracture-fracture intersection and the matrix-fracture intersection.

2. The method of claim 1, wherein obtaining the matrix grid comprises:
   calculating transmissibilities between intersecting matrix grid control volumes; and
   generating the matrix grid based on the transmissibilities between intersecting matrix grid control volumes.

3. The method of claim 1, wherein the fracture network is non-linear.

4. The method of claim 3, wherein the fracture network comprises a plurality of planes.

5. The method of claim 4, wherein identifying the location of the fracture-fracture intersections within the fracture network comprises identifying intersections between planes of the plurality of planes.

6. The method of claim 1, wherein discretizing the fracture network into the plurality of fracture network control volumes comprises:
   discretizing the fracture network into a set of points;
   obtaining a square size value;
   positioning a square in a plurality of positions in the fracture network, where a size of the square is based on the square size value; and
   moving points within the square to a center of the square based on determining that two or more points of the set of points are within the square in a position.

7. The method of claim 6, further comprising generating a mesh of triangles by connecting points of the set of points.

8. The method of claim 7, further comprising:
   analyzing the mesh of triangles to identify abnormal triangles;
   transforming the abnormal triangles;
   obtaining a cube size value;
   positioning a cube in a plurality of positions in the fracture network, where a size of the cube is based on the cube size value;
   moving a point within the cube in a first position to a center of the cube based on determining that the point is a single point within the cube;
   removing an edge and two triangles that include the edge within the cube in a second position, placing a first new point at the center of the cube, and joining triangles surrounding the two removed triangles at the first new point, based on determining that the edge is within the cube; and
   removing a triangle and three triangles that share an edge with the triangle within the cube in a third position, placing a second new point at the center of the cube, and joining triangles surrounding the three removed triangles at the second new point, based on determining that the triangle is within the cube.

9. The method of claim 1, further comprising generating a visualization based on the reservoir simulation.

10. The method of claim 1, wherein the fracture network is discretized using a selected resolution that is different than a resolution of the matrix grid.

11. A computing system comprising:
one or more processors; and
a memory system comprising one or more non-transitory, computer-readable media storing instructions that, when executed by at least one of the one or more processors, cause the computing system to perform operations, the operations comprising:
receiving data representing a subterranean formation;
obtaining a matrix grid based on the data representing the subterranean formation, wherein the matrix grid comprises a plurality of matrix grid control volumes;
generating a fracture network based on the data representing the subterranean formation;
identifying a location of a fracture-fracture intersection within the fracture network;
discretizing the fracture network into a plurality of fracture network control volumes, wherein the fracture network is discretized independently of the matrix grid, and wherein each of the fracture network control volumes comprises a fracture network control volume center;
identifying a location of a matrix-fracture intersection between the plurality of matrix grid control volumes and the plurality of fracture network control volumes, wherein identifying the location of the matrix-fracture intersection comprises identifying a matrix-fracture intersection where a matrix grid control volume contains at least one of the fracture network control volume centers;
calculating a transmissibility for the fracture-fracture intersection and the matrix-fracture intersection; and
performing a reservoir simulation based on the transmissibility for the fracture-fracture intersection and the matrix-fracture intersection.

12. The system of claim 11, wherein obtaining the matrix grid comprises:
calculating transmissibilities between intersecting matrix grid control volumes; and
generating the matrix grid based on the transmissibilities between intersecting matrix grid control volumes.

13. The system of claim 11, wherein the fracture network is non-linear.

14. The system of claim 13, wherein the fracture network comprises a plurality of planes.

15. The system of claim 14, wherein identifying the location of the fracture-fracture intersections within the fracture network comprises identifying intersections between planes of the plurality of planes.

16. The system of claim 11, wherein discretizing the fracture network into the plurality of fracture network control volumes comprises:
discretizing the fracture network into a set of points;
obtaining a square size value;
positioning a square in a plurality of positions in the fracture network, where a size of the square is based on the square size value; and
moving points within the square to a center of the square based on determining that two or more points of the set of points are within the square in a position.

17. The system of claim 16, the operations further comprising generating a mesh of triangles by connecting points of the set of points.

18. The system of claim 17, the operations further comprising:
analyzing the mesh of triangles to identify abnormal triangles;
transforming the abnormal triangles;
obtaining a cube size value;
positioning a cube in a plurality of positions in the fracture network, where a size of the cube is based on the cube size value;
moving a point within the cube in a first position to a center of the cube based on determining that the point is a single point within the cube;
removing an edge and two triangles that include the edge within the cube in a second position, placing a first new point at the center of the cube, and joining triangles surrounding the two removed triangles at the first new point, based on determining that the edge is within the cube; and
removing a triangle and three triangles that share an edge with the triangle within the cube in a third position, placing a second new point at the center of the cube, and joining triangles surrounding the three removed triangles at the second new point, based on determining that the triangle is within the cube.

19. A non-transitory, computer-readable medium storing instructions that, when executed by one or more processors of a computing system, cause the computing system to perform operations, the operations comprising:
receiving data representing a subterranean formation;
obtaining a matrix grid based on the data representing the subterranean formation, wherein the matrix grid comprises a plurality of matrix grid control volumes;
generating a fracture network based on the data representing the subterranean formation;
identifying a location of a fracture-fracture intersection within the fracture network;
discretizing the fracture network into a plurality of fracture network control volumes, wherein the fracture network is discretized independently of the matrix grid, and wherein each of the fracture network control volumes comprises a fracture network control volume center;
identifying a location of a matrix-fracture intersection between the plurality of matrix grid control volumes and the plurality of fracture network control volumes, wherein identifying the location of the matrix-fracture intersection comprises identifying a matrix-fracture intersection where a matrix grid control volume contains at least one of the fracture network control volume centers;
calculating a transmissibility for the fracture-fracture intersection and the matrix-fracture intersection; and
performing a reservoir simulation based on the transmissibility for the fracture-fracture intersection and the matrix-fracture intersection.

\* \* \* \* \*